United States Patent
Wang et al.

(10) Patent No.: US 8,775,897 B2
(45) Date of Patent: Jul. 8, 2014

(54) DATA PROCESSING SYSTEM WITH FAILURE RECOVERY

(75) Inventors: Chung-Li Wang, San Jose, CA (US); Lei Chen, Santa Clara, CA (US); Fan Zhang, Milpitas, CA (US); Shaohua Yang, San Jose, CA (US); Johnson Yen, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 129 days.

(21) Appl. No.: 13/465,214

(22) Filed: May 7, 2012

(65) Prior Publication Data

US 2013/0297983 A1    Nov. 7, 2013

(51) Int. Cl.
*H03M 13/00* (2006.01)
*H03M 13/09* (2006.01)
*H03M 13/47* (2006.01)
*H03M 13/25* (2006.01)

(52) U.S. Cl.
CPC .............. *H03M 13/09* (2013.01); *H03M 13/47* (2013.01); *H03M 13/255* (2013.01)
USPC ........... 714/758; 714/752; 714/780; 714/781; 714/795; 714/799

(58) Field of Classification Search
CPC .... H03M 13/09; H03M 13/47; H03M 13/255
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 6,848,069 B1 * | 1/2005 | Levy et al. | 714/755 |
| 7,136,244 B1 | 11/2006 | Rothberg | |
| 7,441,175 B2 * | 10/2008 | Yeh et al. | 714/758 |
| 7,702,989 B2 | 4/2010 | Graef | |
| 7,730,384 B2 | 6/2010 | Graef | |
| 7,738,201 B2 | 6/2010 | Jin | |
| 7,971,125 B2 | 6/2011 | Graef | |
| 7,990,642 B2 | 8/2011 | Lee | |
| 8,176,404 B2 | 5/2012 | Yang | |
| 2009/0132893 A1 * | 5/2009 | Miyazaki et al. | 714/776 |
| 2009/0199073 A1 * | 8/2009 | Kanaoka et al. | 714/758 |
| 2009/0259917 A1 * | 10/2009 | Spencer | 714/758 |
| 2010/0195571 A1 * | 8/2010 | Kuri et al. | 370/328 |

(Continued)

OTHER PUBLICATIONS

Olmos et al., "Tree-Structure Expectation Propagation for LDPC Decoding in Erasure Channels", Cornell University Library arXiv:1009.4287 (Sep. 22, 2010).

(Continued)

*Primary Examiner* — John Trimmings
(74) *Attorney, Agent, or Firm* — Hamilton DeSanctuis & Cha

(57) ABSTRACT

Various embodiments of the present invention provide systems and methods for a data processing system with failure recovery. For example, a data processing system is disclosed that includes a data processing circuit operable to process a block of data from an input and to yield a plurality of possible results based on the block of data, and an error detection circuit operable to test the plurality of possible results for errors and to report to the data processing circuit whether the plurality of possible results contain errors. The data processing system is operable to output any of the possible results in which the error detection circuit found no errors.

20 Claims, 5 Drawing Sheets

(56) References Cited

U.S. PATENT DOCUMENTS

| | | |
|---|---|---|
| 2011/0080211 A1 | 4/2011 | Yang |
| 2011/0161633 A1 | 6/2011 | Xu |
| 2011/0209029 A1* | 8/2011 | Zopf .......................... 714/758 |
| 2012/0030539 A1* | 2/2012 | Graef et al. ................. 714/758 |
| 2012/0200954 A1 | 8/2012 | Jin |
| 2012/0236429 A1 | 9/2012 | Yang |

OTHER PUBLICATIONS

U.S. Appl. No. 13/326,363, filed Dec. 15, 2011, Fan Zhang, Unpublished.

U.S. Appl. No. 13/445,858, filed Apr. 12, 2012, Johnson Yen, Unpublished.

U.S. Appl. No. 13/459,282, filed Apr. 30, 2012, Fan Zhang, Unpublished.

U.S. Appl. No. 13/412,492, filed Mar. 5, 2012, Shaohua Yang, Unpublished.

U.S. Appl. No. 13/326,367, filed Dec. 15, 2011, Shaohua Yang, Unpublished.

U.S. Appl. No. 13/372,600, filed Feb. 14, 2012, Shaohua Yang, Unpublished.

* cited by examiner

DATA PROCESSING SYSTEM WITH FAILURE RECOVERY

BACKGROUND

Various data processing systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored or transmitted in the form of digital data, errors may be introduced that, if not corrected, can corrupt the data and render the information unusable. The effectiveness of any transfer is impacted by any losses in data caused by various factors. Many types of data processors have been developed to detect and correct errors in digital data. For example, data decoders such as Low Density Parity Check (LDPC) decoders may be used to decode the values of data bits or multi-bit symbols retrieved from storage or transmission systems.

Some LDPC data decoders implement error correction techniques such as bit or symbol flipping. In such decoders, if conventional data decoding fails to determine the correct data values and satisfy parity checks, the value of some bits or symbols in a block of data may be changed or flipped during a decoding process in an attempt to determine the correct data values. However, bit or symbol flipping may result in output data that is still incorrect despite satisfying parity checks in the decoder.

A need therefore remains for a data processing system with improved error detection and correction.

BRIEF SUMMARY

Various embodiments of the present invention provide systems and methods for a data processing system with failure recovery. For example, a data processing system is disclosed having a data processing circuit that processes an input data block in sections, generating at least one possible section result for each of the sections of the input data block, and in some embodiments providing multiple possible results for at least one of the sections. A number of possible results for the input data block can be generated by combining different versions of each of the section results. The possible results for the input data block are checked for errors in an error detection circuit to determine which, if any, of the possible results is correct and error-free. In some embodiments, the input data block comprises a data sector read from a magnetic hard disk or received from a transmission medium, the section results comprise hard decisions for component codewords of the data sector, the results comprise hard decisions for the data sector made up of hard decisions for each of the component codewords of the data sector, and the data processing system yields as output at least the result that passes the error check. In some instances of the aforementioned embodiments, the data processing circuit is an LDPC decoder and the error detection circuit is a cyclic redundancy check (CRC) circuit.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Figure 1:
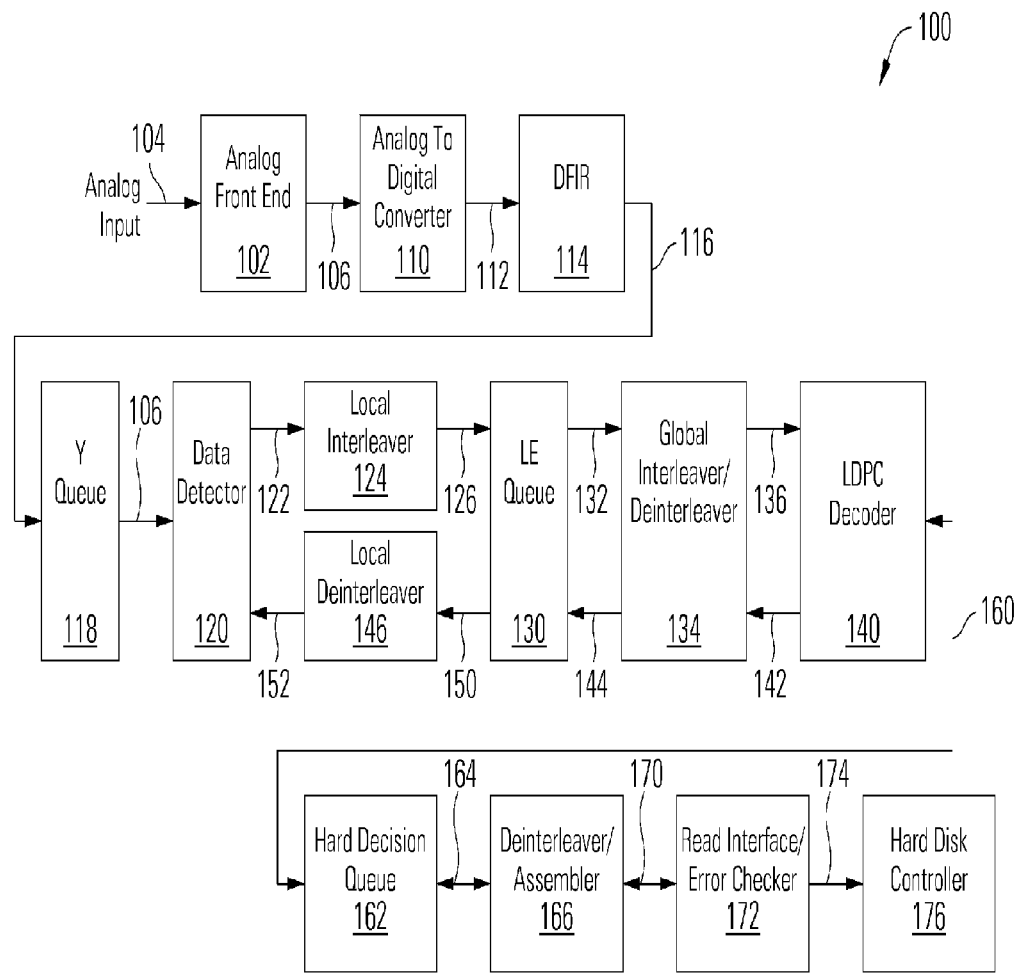
FIG. 1 depicts a block diagram of a data processing system with failure recovery in accordance with some embodiments of the present inventions.

Various embodiments of the present invention are related to apparatuses and methods for data processing with failure recovery, and in particular to data decoding with additional error checking and failure recovery. A data processing system implements one or more error correction techniques that can produce multiple outputs as the results of repeated error correction trials. For example, the data processing system may include an LDPC decoder that decodes component codewords and that yields a decoded output when parity checks are satisfied for the decoded component codewords. Such an LDPC decoder may also include a bit or symbol flipping function, applied for example if the component codewords being decoded fail to satisfy parity checks. One or more bits or symbols are flipped by changing their values during a decoding operation in an attempt to cause the component codewords to converge on values which satisfy parity checks. Such a flipping operation may be performed multiple times, with each decoding operation generating another output for the component codeword being decoded. In some cases, more than one possible decoded component codeword may satisfy parity checks, even if they contain different values and cannot all represent the original block of data or data sector which the data processing system is attempting to recover. The term "symbol flipping" is used below to refer to changing the value of one or more bits of data, and thus includes single bit flipping operations as well as multi-bit flipping operations.

The data processing system also performs additional error checking and failure recovery. For example, multiple possible versions of a data sector may be assembled based on the decoded component codewords resulting from the decoding operations for a data sector, some of which may have been produced using symbol flipping. The possible versions of the decoded component codewords or of the assembled data sectors are passed through an error checking circuit or process, such as a cyclic redundancy check (CRC) circuit, to determine which, if any, of the possible versions represent the original data which the data processing system is attempting to recover. In addition to identifying which of a number of possible versions of decoded component codewords or of a data sector are correct, the results of the error checking may also be returned to the data processor to guide further data processing operations on the data. For example, in a data processing system with an LDPC decoder with symbol flipping capability, the results from a CRC check may be returned from the CRC circuit to the LDPC decoder to guide subsequent decoding with symbol flipping on the data for which decoding previously failed.

The data processing system with failure recovery is not limited to any particular data processor or error checking device, and the LDPC decoder and CRC circuit disclosed in several embodiments are examples intended to illustrate some features of the present inventions.

Generally, a data processing circuit in the data processing system processes an input data block in sections, generating at least one possible section result for each of the sections of the input data block, and in some embodiments providing multiple possible results for at least one of the sections. A number of possible results for the input data block can be generated by combining different versions of each of the section results. The possible results for the input data block are checked for errors in an error detection circuit to determine which, if any, of the possible results is correct and error-free. In some embodiments, the input data block comprises a data sector read from a magnetic hard disk or received from a transmission medium, the section results comprise hard decisions for component codewords of the data sector, the results comprise hard decisions for the data sector made up of hard decisions for each of the component codewords of the data sector, and the data processing system yields as output at least the result that passes the error check.

Turning to FIG. 1, a block diagram depicts a data processing system with failure recovery 100 in accordance with some embodiments of the present inventions. In particular, data processing system with failure recovery 100 may comprises a read channel for a magnetic storage device such as a hard disk drive. Data processing system 100 includes an analog front end circuit 102 that receives an analog signal 104. Analog front end circuit 102 processes analog signal 104 and provides a processed analog signal 106 to an analog to digital converter circuit 110. Analog front end circuit 102 may include, but is not limited to, an analog filter and an amplifier circuit as are known in the art. Based upon the disclosure provided herein, one of ordinary skill in the art will recognize a variety of circuitry that may be included as part of analog front end circuit 102. In some cases, analog signal 104 is derived from a read/write head assembly (e.g., 120) that is disposed in relation to a storage medium (e.g., 116). In other cases, analog signal 104 is derived from a receiver circuit (e.g., 204) that is operable to receive a signal from a transmission medium (e.g., 206). The transmission medium may be wired or wireless. Based upon the disclosure provided herein, one of ordinary skill in the art will recognize a variety of sources from which analog input 104 may be derived.

Analog to digital converter circuit 110 converts processed analog signal 106 into a corresponding series of digital samples 112. Analog to digital converter circuit 110 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 112 are provided to an equalizer circuit 114. Equalizer circuit 114 applies an equalization algorithm to digital samples 112 to yield an equalized output 116. In some embodiments of the present inventions, equalizer circuit 114 is a digital finite impulse response (DFIR) filter circuit as are known in the art. In some cases, equalizer 114 includes sufficient memory to maintain one or more codewords until a data detector circuit 120 is available for processing. It may be possible that equalized output 116 may be received directly from a storage device in, for example, a solid state storage system. In such cases, analog front end circuit 102, analog to digital converter circuit 110 and equalizer circuit 114 may be eliminated where the data is received as a digital data input.

Data detector circuit 120 is operable to apply a data detection algorithm to a received codeword or data set, and in some cases data detector circuit 120 can process two or more codewords in parallel. In some embodiments of the present inventions, data detector circuit 120 is a Viterbi algorithm data detector circuit as is known in the art. In other embodiments of the present inventions, data detector circuit 120 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector circuit 120 is started based upon availability of a data set from equalizer circuit 114 or from a central memory circuit 130.

Upon completion, data detector circuit 120 provides detector output 122. Detector output 122 includes soft data. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art. Detected output 122 is provided to a local interleaver circuit 124. Local interleaver circuit 124 is operable to shuffle subportions (i.e., local chunks) of the data set included as detected output 122 and provides an interleaved codeword 126 that is stored to central memory circuit 130. Interleaver circuit 124 may be any circuit known in the art that is capable of shuffling data sets to yield a re-arranged data set. Interleaved codeword 126 is stored to central memory circuit 130. The interleaved codeword 126 is accessed from central memory circuit 130 as a stored codeword 132 and globally interleaved by a global interleaver/de-interleaver circuit 134. Global interleaver/De-interleaver circuit 134 may be any circuit known in the art that is capable of globally rearranging codewords. Global interleaver/De-interleaver circuit 134 provides a decoder input 136 into a low density parity check (LDPC) decoder 140. Based upon the disclosure provided herein, one of ordinary skill in the art will recognize other decode algorithms that may be used in relation to different embodiments of the present inventions. The LDPC decoder 140 applies a data decode algorithm to decoder input 136 in a variable number of local iterations. The LDPC decoder 140 may also be operable to perform additional error correction functions such as bit or symbol flipping.

Where the LDPC decoder 140 fails to converge (i.e., fails to yield the originally written data set) and a number of local iterations through LDPC decoder 140 exceeds a threshold, the resulting decoded output is provided as a decoded output 142 back to central memory circuit 130 where it is stored awaiting another global iteration through data detector circuit 120 and LDPC decoder 140. Multiple sectors may be processed simultaneously in the data processing system 100, with additional sectors being admitted to the data detector 120 as other sectors converge in the LDPC decoder 140 and are output and cleared from the Y queue 118 and LE queue 130.

Prior to storage of decoded output 142 to central memory circuit 130, decoded output 142 is globally de-interleaved to yield a globally de-interleaved output 144 that is stored to central memory circuit 130. The global de-interleaving reverses the global interleaving earlier applied to stored codeword 132 to yield decoder input 136. Once data detector circuit 120 is available, a previously stored de-interleaved output 144 is accessed from central memory circuit 130 and locally de-interleaved by a de-interleaver circuit 146. De-interleaver circuit 146 re-arranges decoder output 150 to reverse the shuffling originally performed by interleaver circuit 124. A resulting de-interleaved output 152 is provided to data detector circuit 120 where it is used to guide subsequent detection of a corresponding data set received as equalized output 116.

Alternatively, where the decoded output converges (i.e., yields the originally written data set) in the LDPC decoder 140, the resulting decoded output is provided as an output codeword 160 to a hard decision queue 162. Stored codewords 164 from the hard decision queue 162 are provided to a de-interleaver/assembler circuit 166. De-interleaver/assembler circuit 166 rearranges the data to reverse both the global and local interleaving applied to the data to yield a de-interleaved output 170. De-interleaver/assembler circuit 166 may also be operable to assembly trial versions of sectors from decoded component codewords in output 160 where multiple versions of component codewords or data sectors are available, for example as generated by symbol flipping trials in LDPC decoder 140. De-interleaved hard decision output 170 is provided to a read interface/error checker 172, which performs additional error checking such as CRC checks on the de-interleaved output 170. The read interface/error checker 172 may report the results of the error checking to the LDPC decoder 140 to guide subsequent decoding operations. If the de-interleaved output 170 passes the error checking in read interface/error checker 172, the data 174 may be forwarded to a hard disk controller 176 or other destination, either automatically after passing or as instructed by the LDPC decoder 140. In other embodiments, the data 174 may be transmitted to the hard disk controller 176 by the LDPC decoder 140 after passing the error checking in read interface/error checker 172.

Figures 2A, 2B:
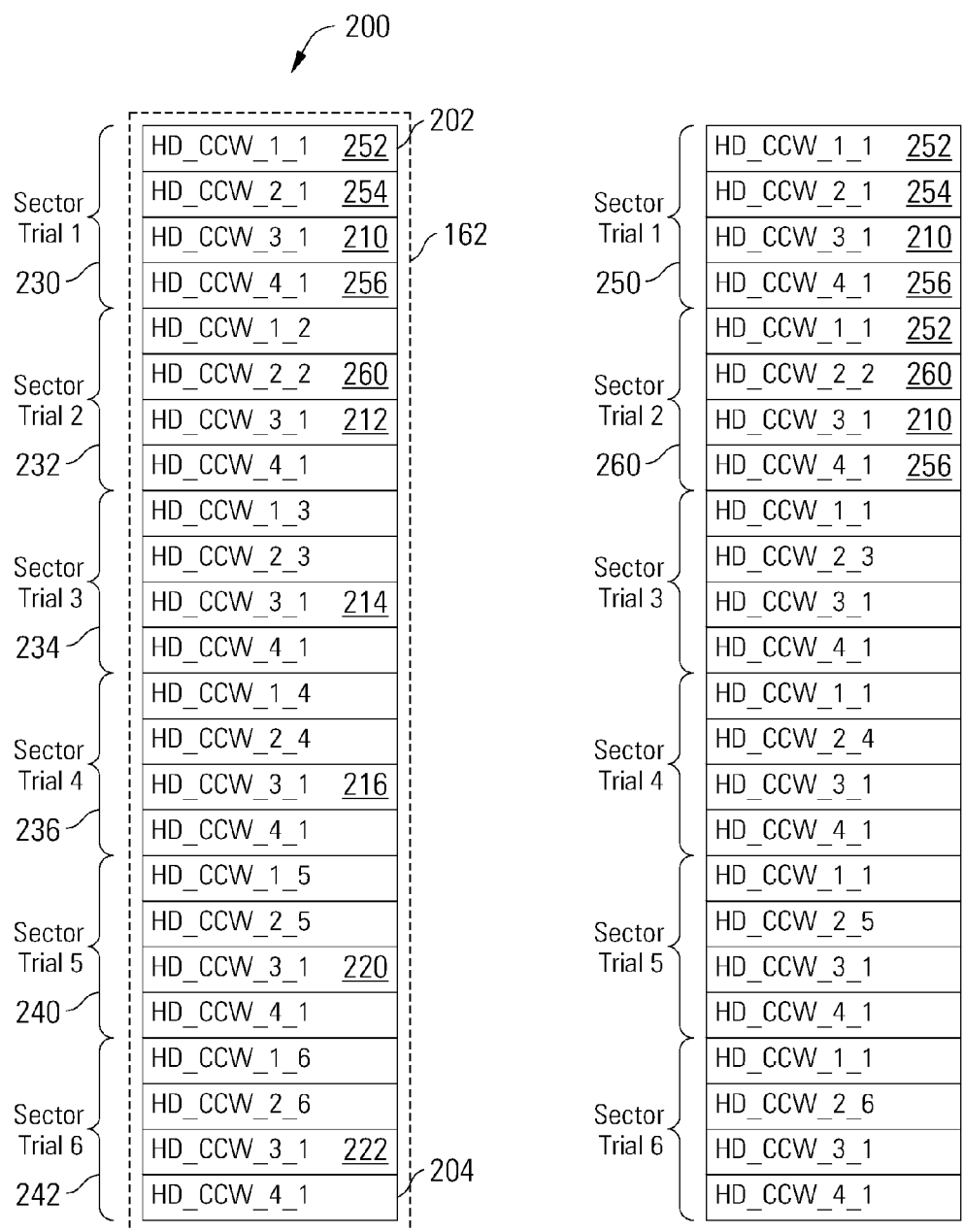
FIG. 2A depicts decoded component codewords for a data sector block resulting from a number of decoding trials and stored in a memory in accordance with some embodiments of the present inventions.
FIG. 2B depicts the decoded component codewords of FIG. 2A as they are assembled in possible outcomes of a data sector for error checking in accordance with some embodiments of the present inventions.

Turning to FIG. 2A, hard decisions for decoded component codewords 200 for a data sector are depicted as they may be produced by a number of decoding trials and stored in a memory such as hard decision queue 162. (A codeword is an LDPC- or otherwise-encoded block of data, and the term "component" indicates that multiple codewords are used for each block of data.) In this embodiment, a data sector is divided into four component codewords which may be independently decoded in an LDPC decoder (e.g., 140) with a normal decoding operation, and in which symbol flipping may be applied, for example when normal decoding fails for a component codeword in the LDPC decoder 140. Thus, the hard decision queue 162 may contain multiple variations of hard decisions for a decoded component codeword, and not just a single version of the hard decisions for each of the four component codewords for the sector. In other embodiments a sector may contain other numbers of component codewords or a single codeword. The hard decisions for each component codeword may also be tested for errors in an external error checker (e.g., 172) such as a CRC circuit if it passes the parity checks in the LDPC decoder 140.

In FIG. 2A, each row (e.g., 202) represents the hard decisions for a component codeword that has been decoded, and is represented by "HD_CCW", followed by the number of the component codeword which indicates which of the four component codewords for the sector are contained in the row, and ending with a number distinguishing the decoding operation or trial that produced the component codeword in the row. For example, row 204 (HD_CCW_4_1) contains the hard decisions for the fourth of four component codewords in the sector as produced by the first decoding operation.

In such an example decoding system, there are a number of possible outcomes:

1) A component codeword may fail to converge on hard decision values in the LDPC decoder 140 which satisfy parity checks.

2) The component codeword may converge on hard decision values in the LDPC decoder 140 which satisfy parity checks. This case includes:

2-1) These hard decisions which satisfy parity checks may fail a CRC test in the error checker 172.

2-2) These hard decisions which satisfy parity checks may pass a CRC test in the error checker 172.

Both the first and third of the cases may be considered a decoding failure which may be used to trigger symbol flipping trials in the LDPC decoder 140. In some embodiments, symbol flipping may be included in the normal decoding operation in an attempt to avoid or identify false convergence in which hard decisions satisfy parity checks but which are not the correct results.

In the example embodiment illustrated in FIG. 2A, only the hard decisions which satisfy parity checks are stored in the hard decision queue 162, some of which may have resulted from repeated decoding operations or from symbol flipping operations. Thus, multiple versions of the hard decisions for a component codeword which satisfy parity checks may be stored in the hard decision queue 162. In this example, the hard decision queue 162 is provided with enough space to store up to six copies of each of the four component codewords. In other embodiments, more or less memory space may be provided for component codeword hard decisions. In this example, up to two of the four component codewords may undergo symbol flipping. In other embodiments, other numbers of component codewords may undergo symbol flipping when parity checks fail, including embodiments in which all component codewords may undergo symbol flipping.

In the example embodiment of FIG. 2A, the hard decisions for all four component codewords for a sector are decoded and provided to the hard decision queue 162 in order during each trial, and because only the first two component codewords are allowed to undergo symbol flipping in this embodiment, the hard decisions for the latter two component codewords may be the same for each trial and are duplicated in the hard decision queue 162 if the normal decoding operation produces the same hard decisions each time. (For example, rows 210, 212, 214, 216, 220 and 222 may be the same if the LDPC decoder 140 converges on the same hard decisions in each decoding operation yielding those rows.) In other embodiments, the decoding system may be adapted to avoid duplicates or the possibility of duplicates in the hard decision queue 162.

After the hard decisions which satisfy parity checks for the four component codewords are available for at least one trial sector, the combinations of the four component codeword hard decisions making up trial sectors may be transferred from the hard decision queue 162 to the error checker 172 for CRC checks on the sector. In some embodiments, CRC checks may be performed on component codewords.

The various component codeword hard decisions 200 in the hard decision queue 162 make up six trial sectors 230, 232, 234, 236, 240 and 242 (or trial versions of the data sector being decoded) in this example embodiment. These six trial sectors 230-242 may be transferred to the error checker 172 as they are laid out in the hard decision queue 162, but there are many more possible combinations that can be made to generate a trial sector from the various component codeword hard decisions in the hard decision queue 162. The de-interleaver/assembler circuit 166 is thus operable to generate these combinations of trial sectors, some of which are illustrated in FIG. 2B.

As illustrated in FIG. 2B, a first trial sector 250 may be generated by the de-interleaver/assembler circuit 166 from the component codeword hard decisions 200 in the hard decision queue 162 using the first versions of the first four component codeword hard decisions 252, 254, 210 and 256 (HD_CCW_1_1, HD_CCW_2_1, HD_CCW_3_1 and HD_CCW_4_1). A second trial sector 260 includes the first version of the first component codeword hard decisions 252, the second version of the second component codeword hard decisions 260, and the first version of the third and fourth component codeword hard decisions 210 and 256 (HD_CCW_1_1, HD_CCW_2_2, HD_CCW_3_1 and HD_CCW_4_1). The trial sectors (e.g., 250 and 260) generated by the de-interleaver/assembler circuit 166 may be buffered or may be transferred to the error checker 172 as they are generated from the component codeword hard decisions 200 in the hard decision queue 162. In some embodiments, the generation of trial sectors by the de-interleaver/assembler circuit 166 and testing in the error checker 172 is performed trial sector by trial sector, and ending when a trial sector passes the CRC or other error checking in the error checker 172. The hard decisions for the trial sector that have passed the parity checks and CRC or other error checking may then be provided at an output, for example by transferring them to a hard disk controller 176 from the read interface/error checker 172 or from the LDPC decoder 140, either via the hard decision queue 162 or directly.

Figure 3:
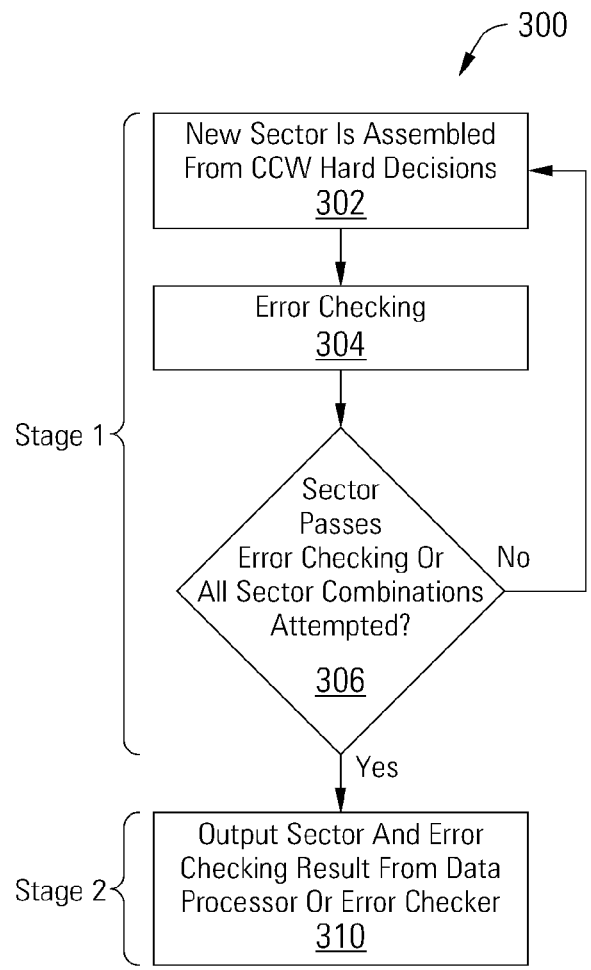
FIG. 3 depicts a flow diagram showing a method for data processing with failure recovery in accordance with some embodiments of the present inventions.

Turning to FIG. 3, a flow diagram 300 depicts a method for data processing with failure recovery in accordance with some embodiments of the present inventions. Following flow diagram 300, a new trial sector is assembled from hard decisions for component codewords. (Block 302) In some embodiments, a variety of possible combinations of component codeword hard decisions may be assembled in different ways to produce a trial sector. Component codeword hard decisions for a sector may be produced, for example, using a decoder such as an LDPC decoder, and may further include additional error correction techniques such as symbol flipping. An error detection process is performed on the trial sector. (Block 304) The error detection process is not limited to any particular type of error detection algorithm. In some embodiments, the error detection process comprises a CRC algorithm. Based upon the disclosure provided herein, one of ordinary skill in the art will recognize a variety of error detection algorithms that may be applied to the trial sector. A determination is made as to whether the trial sector passes the error detection process without errors, or whether all possible combinations of component codeword hard decisions for the sector have been assembled (block 302) and passed through the error detection process (block 304). (Block 306) If neither is true, another trial sector is assembled from component codeword hard decisions for the sector have been assembled (block 302) and passed through the error detection process (block 304), repeating a first stage of the method 300.

If no errors are detected in the trial sector during the error detection process of block 306, the sector is output from the data processor or error checker in a second stage of the method. (Block 310) If all possible combinations for the sector have been assembled (block 302) and checked (block 304), the sector is output from the data processor or error checker, even if errors are identified in the sector during the error detection process. (Block 306) The results of the error detection process may also be output with the sector (block 310), indicating whether the sector was successfully decoded without errors. In the event that no trial sector passes the error detection without errors, the results of the error detection process signal to the recipient of the data that errors remain that could not be corrected by the decoder. The sector and error checking result may be output to a data recipient such as a hard disk controller, and may be output from the error checking circuit or from a data decoder or other device that produces the component codeword hard decisions.

Figure 4:
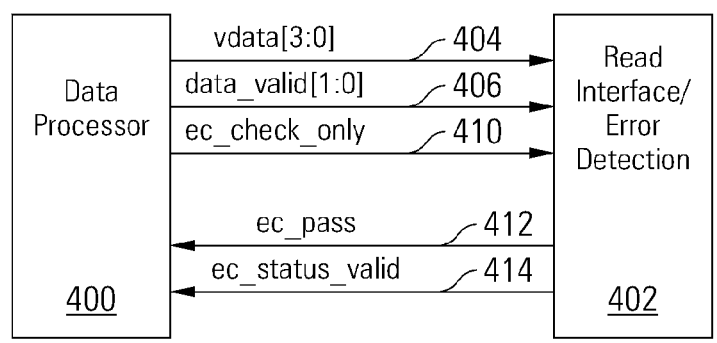
FIG. 4 depicts a block diagram of a data processor and a read interface with error checking with connecting interface signals in accordance with some embodiments of the present inventions.

Turning to FIG. 4, a data processor 400 and a read interface with error detection 402 with connecting interface signals are depicted in accordance with some embodiments of the present inventions. The data processor may comprise any system or device for processing data in any manner, such as but not limited to an LDPC decoder. The read interface with error detection 402 comprises an interface circuit to receive data from the data processor 400 and to pass the data to an external device such as a hard disk controller (e.g., 176). For example, the read interface with error detection 402 may be operable to receive read commands from a hard disk controller and to control the data processor 400 to process the requested data. The read interface with error detection 402 also includes an error detection device such as, but not limited to, a CRC circuit or software. The data processor 400 prepares hard decisions for component codewords as disclosed above with respect to FIG. 3 and transfers them to the read interface with error detection 402 for error checking.

In the example embodiment of FIG. 4, the data processor 400 transfers component codeword hard decisions to the read interface with error detection 402 via a vdata interface signal 404. The vdata interface signal 404 may be a parallel or serial interface or may use any suitable bus or other communications architecture and protocol. In the example of FIG. 4, sector data is transmitted using the vdata interface signal 404 four bits at a time. A data_valid signal 406 is asserted as data is transferred, indicating to the read interface with error detection 402 that the vdata interface signal 404 is in a valid state and that data may be retrieved from the vdata interface signal 404. The data_valid signal 406 may be a simple indicator signal or may carry additional information, such as an indication of which four bit portion of a data word is currently on the vdata interface signal 404. An ec_check_only signal 410 may be asserted by the data processor 400 to indicate to the read interface with error detection 402 that the data currently being transferred should be checked for errors only but not transferred to a hard disk controller or otherwise output from the system.

The read interface with error detection 402 asserts an ec_pass signal 412 if the sector from the data processor 400 passes the error detection process without errors, with an ec_status_valid signal 414 indicating that the ec_pass signal 412 is valid. Thus, the read interface with error detection 402 can indicate that the sector contains errors by asserting the ec_status_valid signal 414 but leaving the ec_pass signal 412 low.

Other interface signals (not shown) such as clock signals or other controls signals may also be included between the data processor 400 and read interface with error detection 402.

During operation, in the first stage of operation, the data processor 400 transfers a trial sector, composed in some embodiments of hard decisions for four component codewords, to the read interface with error detection 402, using the vdata interface signal 404 and data_valid signal 406 and asserting the ec_check_only signal 410 to request error checking only. The read interface with error detection 402 then performs error checking on the trial sector and reports the results to the data processor 400 using the ec_pass signal 412 and ec_status_valid signal 414. If the ec_pass signal 412 was not asserted when the ec_status_valid signal 414 signals the reporting of the error check results, and if another trial sector is available from the data processor 400, stage one continues by transferring the next trial sector from the data processor 400 to the read interface with error detection 402 for error checking, again asserting the ec_check_only signal 410. The assembly of trial sectors may continue in the data processor 400 in parallel with error checking by the read interface with error detection 402.

Error checking of trial sectors ends during the second stage of operation either when a trial sector passes the error checking in the read interface with error detection 402 or when all possible combinations of component codeword hard decisions for a sector are exhausted without passing the error check. In the first instance, when a trial sector passes the error checking in the read interface with error detection 402 with no errors, the read interface with error detection 402 signals success to the data processor 400 by asserting the ec_pass signal 412 and the ec_status_valid signal 414. In the second instance, when a trial sector fails the error checking in the read interface with error detection 402, the read interface with error detection 402 signals failure to the data processor 400 by leaving the ec_pass signal 412 signal un-asserted while asserting the ec_status_valid signal 414, and the data processor 400 will be aware if the failed trial sector was the last possible combination. In either instance, the data processor 400 then signals the end of processing to the read interface with error detection 402 by leaving ec_check_only signal 410 un-asserted while resending the passing trial sector or the last possible trial sector that failed the error check. The read interface with error detection 402 then outputs the last received trial sector to the hard disk controller or other recipient, along with an indication of whether the error check passed or failed for the last sector being output.

Figure 5:
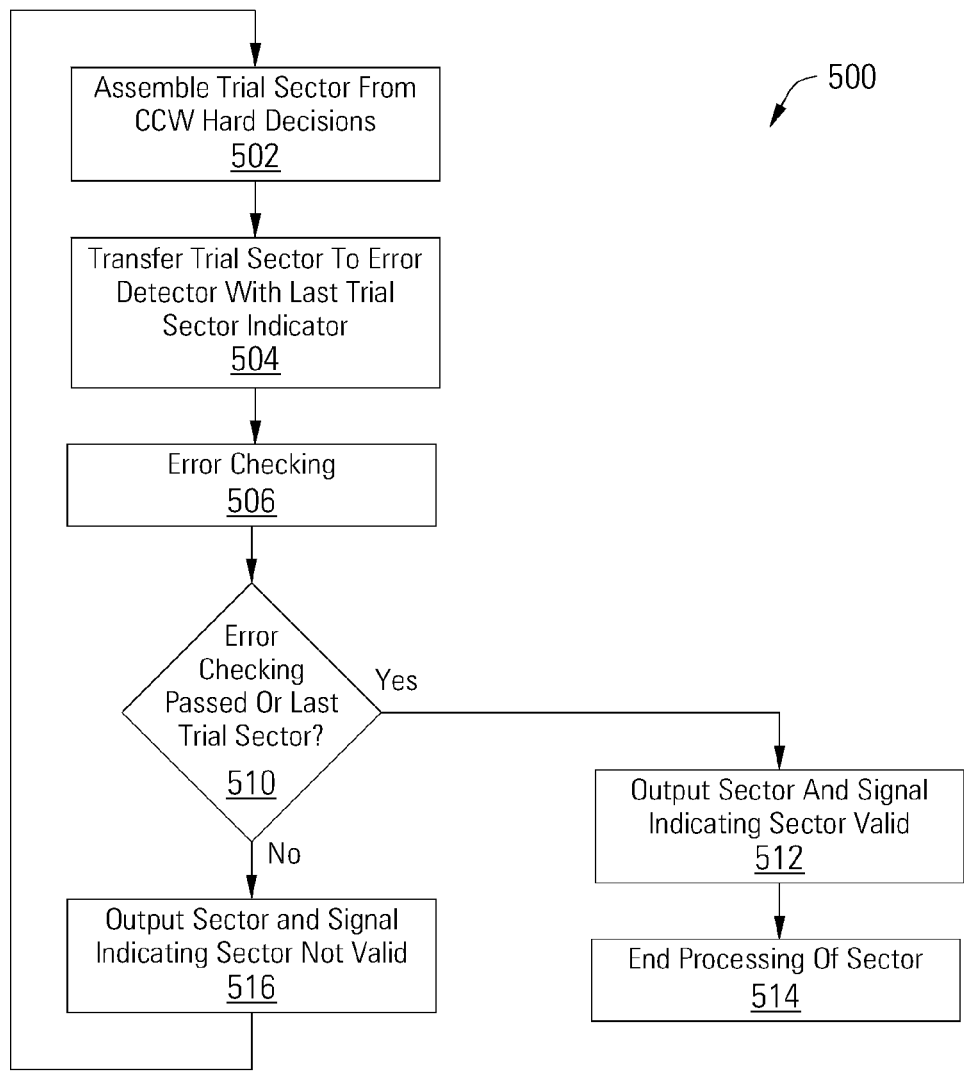
FIG. 5 depicts a flow diagram showing a method for data processing with failure recovery in accordance with some embodiments of the present inventions.

Turning to FIG. 5, another method for data processing with failure recovery is depicted in accordance with some embodiments of the present inventions. Following flow diagram 500, a new trial sector is assembled from hard decisions for component codewords. (Block 502) In some embodiments, a variety of possible combinations of component codeword hard decisions may be assembled in different ways to produce a trial sector. Component codeword hard decisions for a sector may be produced, for example, using a decoder such as an LDPC decoder, and may be produced in some embodiments using error correction techniques such as symbol flipping. The trial sector is transferred to an error detector along with an indication of whether the trial sector is the last possible trial sector that can be formed from the available hard decisions for the component codewords. (Block 504) For example, the trial sector may be transferred to a read interface/error checker 172. An error detection process is performed on the trial sector. (Block 506) The error detection process is not limited to any particular type of error detection algorithm. In some embodiments, the error detection process comprises a CRC algorithm. Based upon the disclosure provided herein, one of ordinary skill in the art will recognize a variety of error detection algorithms that may be applied to the trial sector. A determination is made as to whether the trial sector passes the error detection process without errors, or whether the trial sector is the last trial sector. (Block 510) If the trial sector contains no errors or if the trial sector is the last, the sector is output along with a signal indicating that the sector is valid. (Block 512) The processing of the sector is ended. (Block 514) If the trial sector contains errors and other trial sectors can be generated, the trial sector is output along with a signal indicating that the output trial sector is not valid. (Block 516) Processing of the sector then continues by assembling another trial sector for error checking (Block 502)

Thus, in the example embodiment of FIG. 5, each trial sector that is generated for error checking is output from the system, for example from read interface/error checker 172 or a LDPC decoder 140 that may be used to produce the trial sectors to a hard disk controller. The output trial sectors are accompanied by a signal indicating whether the output sector is valid, which is asserted if the trial sector had no errors or if it is the last possible trial sector.

Processing of the sector continues as long as different trial sectors can be formed and until a trial sector passes the error detection process without errors.

Figure 6:
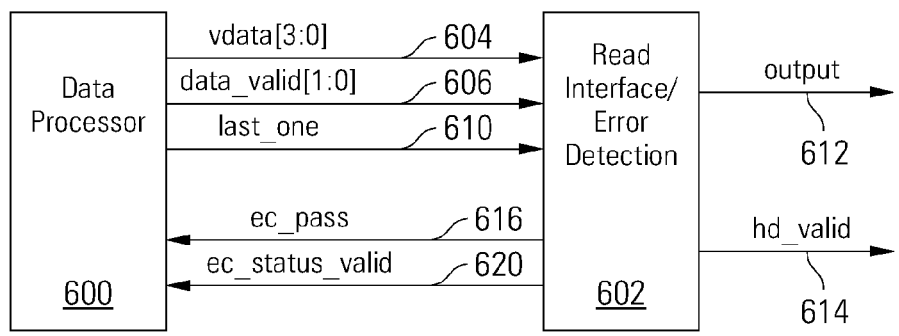
FIG. 6 depicts a block diagram of a data processor and a read interface with a number of interface signals between the two in accordance with some embodiments of the present inventions.

Turning to FIG. 6, a data processor 600 and a read interface with error detection 602 with connecting interface signals are depicted in accordance with some embodiments of the present inventions. The data processor 600 may comprise any system or device for processing data in any manner, such as but not limited to an LDPC decoder. The read interface with error detection 602 may comprise an interface circuit to receive data from the data processor 400 and to pass the data to an external device such as a hard disk controller (e.g., 176). For example, the read interface with error detection 602 may be operable to receive read commands from a hard disk controller and to control the data processor 600 to process the requested data. The read interface with error detection 602 also includes an error detection device such as, but not limited to, a CRC circuit or software. The data processor 600 prepares hard decisions for component codewords as disclosed above with respect to FIG. 3 and transfers them to the read interface with error detection 602 for error checking.

In the example embodiment of FIG. 6, the data processor 600 transfers component codeword hard decisions to the read interface with error detection 602 via a vdata interface signal 604. The vdata interface signal 604 may be a parallel or serial interface or may use any suitable bus or other communications architecture and protocol. In the example of FIG. 6, sector data is transmitted using the vdata interface signal 604 four bits at a time. A data_valid signal 606 is asserted as data is transferred, indicating to the read interface with error detection 602 that the vdata interface signal 604 is in a valid state and that data may be retrieved from the vdata interface signal 604. A last_one signal 610 is asserted by the data processor 600 to indicate to the read interface with error detection 602 that the trial sector currently being transferred is the last trial sector that will be transferred for error detection.

Each trial sector received by the 602 from the data processor 600 for error detection is output from the read interface with error detection 602, for example at output 612 to a hard disk controller, along with an hd_valid signal 614 that is asserted if the trial sector passed error detection with no errors or if the trial sector was the last (as identified by the last_one signal 610 from the data processor 600.

The read interface with error detection 402 also responds to the data processor 600 after the error detection process for each tested trial sector using an ec_pass signal 616 to indicate if the trial sector passed the error detection process without errors, and with an ec_status_valid signal 620 indicating that the ec_pass signal 412 is valid. When the ec_pass signal 616 and ec_status_valid signal 620 are both asserted by the read interface with error detection 602, the data processor 600 can end the processing of the current sector and can proceed to process another sector.

Other interface signals (not shown) such as clock signals or other controls signals may also be included between the data processor 600 and read interface with error detection 602.

The data processing system with failure recovery disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 7:
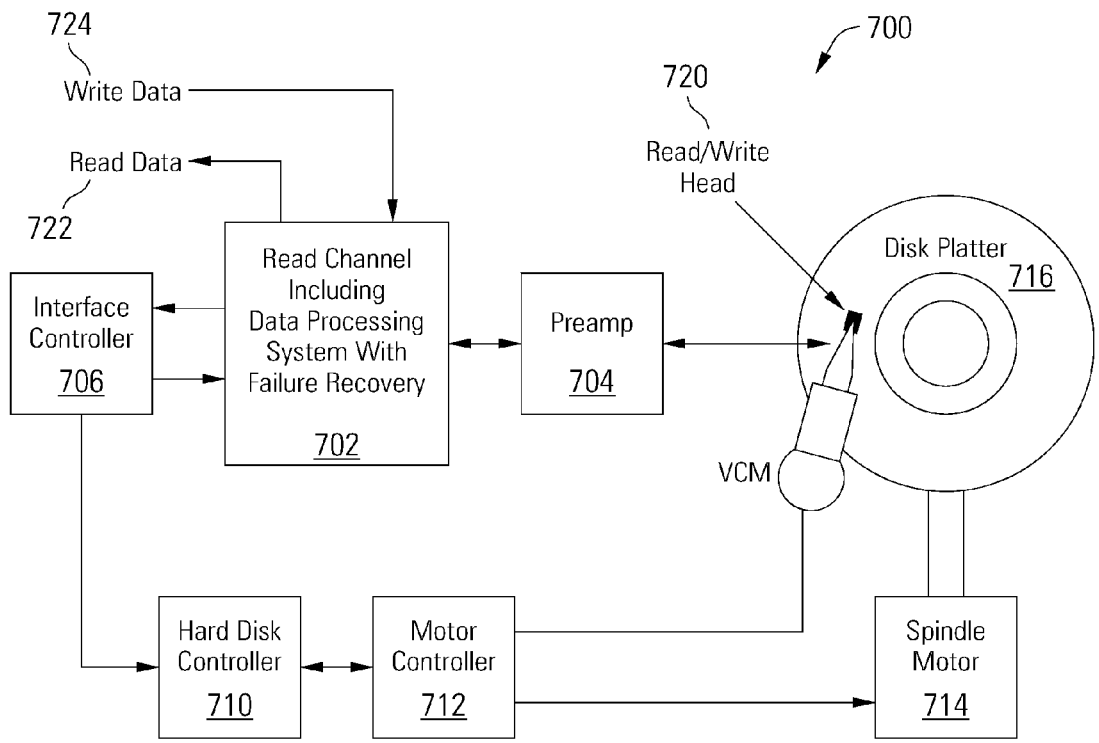
FIG. 7 depicts a storage system including a data processing system with failure recovery in accordance with some embodiments of the present inventions.
Figure 8:
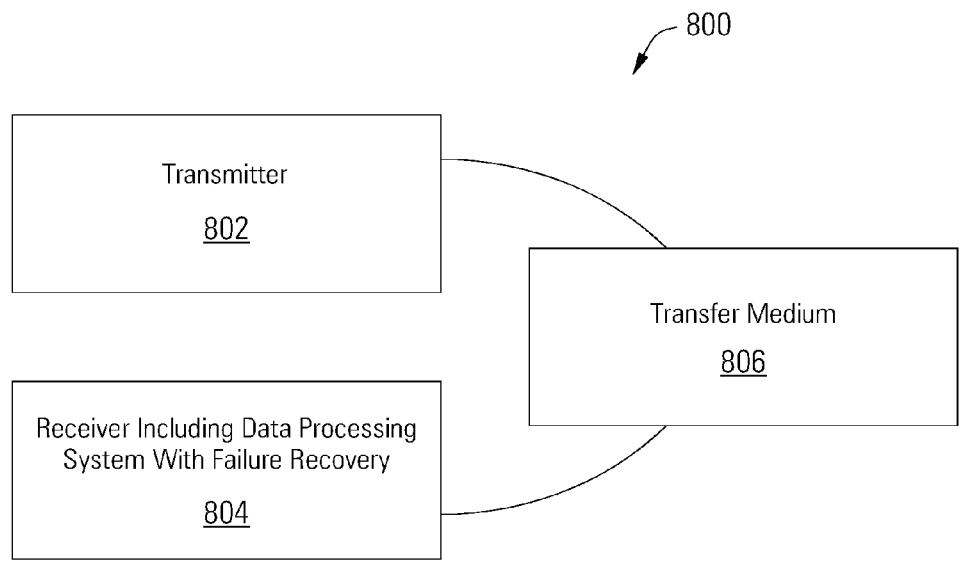
FIG. 8 depicts a wireless communication system including a data processing system with failure recovery in accordance with some embodiments of the present inventions.

Although the data processing system with failure recovery disclosed herein is not limited to any particular application, several examples of applications are illustrated in FIGS. 7 and 8 that benefit from embodiments of the present invention. Turning to FIG. 7, a storage system 700 is illustrated as an example application of a data processing system with failure recovery in accordance with some embodiments of the present inventions. The storage system 700 includes a read channel circuit 702 with a data processing system with failure recovery in accordance with some embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using a data processing system with failure recovery. Such a data processing system with failure recovery may be implemented consistent with that disclosed above in relation to FIGS. 4 and 6. In some cases, the data processing with failure recovery may be performed consistent with the flow diagrams disclosed above in relation to FIGS. 3 and 5. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 8, a wireless communication system 800 or data transmission device including a receiver 804 with a data processing system with failure recovery is shown in accordance with some embodiments of the present inventions. Communication system 800 includes a transmitter 802 that is operable to transmit encoded information via a transfer medium 806 as is known in the art. The encoded data is received from transfer medium 806 by receiver 804. Receiver 804 incorporates a data processing system with failure recovery. Such a data processing system with failure recovery may be implemented consistent with that disclosed above in relation to FIGS. 4 and 6. In some cases, the data processing with failure recovery may be performed consistent with the flow diagrams disclosed above in relation to FIGS. 3 and 5.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for a data processing system with failure recovery. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
   a data processing circuit operable to process a block of data from an input and to yield a plurality of possible results based on the block of data;
   an error detection circuit operable to test the plurality of possible results for errors and to report to the data processing circuit whether the plurality of possible results contain errors, wherein the apparatus is operable to output any of the possible results in which the error detection circuit found no errors; and
   an error check only signal operable to transfer an instruction from the data processing circuit to the error detection circuit to test the possible results for errors without outputting the possible results.

2. The apparatus of claim 1, wherein the data processing circuit is operable to process the block of data in sections and to produce at least one section result for each of the sections and to produce a plurality of different section results for at least one of the sections.

3. The apparatus of claim 2, further comprising an assembler circuit operable to combine the section results from the data processing circuit in different combinations to yield the plurality of possible results based on the block of data.

4. The apparatus of claim 1, wherein the data processing circuit comprises a low density parity check decoder.

5. The apparatus of claim 4, wherein the low density parity check decoder is operable to perform symbol flipping to yield the plurality of possible outputs.

6. The apparatus of claim 1, wherein the error detection circuit comprises a cyclic redundancy check circuit.

7. The apparatus of claim 1, further comprising a data signal operable to transfer the possible results from the data processing circuit to the error detection circuit, and an error status signal operable to report from the error detection circuit to the data processing circuit whether the possible results contain errors.

8. The apparatus of claim 7, wherein the error detection circuit is operable to output the possible results in which the error detection circuit found no errors.

9. The apparatus of claim 8, wherein the error detection circuit is operable to output the possible results when the error check only signal is not asserted by the data processing circuit as the possible results are transferred.

10. The apparatus of claim 1, further comprising a data signal operable to transfer the possible results from the data processing circuit to the error detection circuit, a last possible results signal operable to transfer an indication from the data processing circuit to the error detection circuit that the possible results being transferred are the last for the block of data, and an error status signal operable to report from the error detection circuit to the data processing circuit whether the possible results contain errors.

11. The apparatus of claim 10, wherein the error detection circuit is operable to output the possible results as selected results along with an error status when the possible results contain no errors or when the possible results are the last for the block of data.

12. The apparatus of claim 1, wherein the error detection circuit is embodied in a read interface circuit operable to control the data processing circuit to read a particular block of data.

13. The apparatus of claim 1, wherein the data processing circuit and the error detection circuit are incorporated in a storage device.

14. The apparatus of claim 1, wherein the data processing circuit and the error detection circuit are incorporated in a storage system comprising a redundant array of independent disks.

15. The apparatus of claim 1, wherein the data processing circuit and the error detection circuit are incorporated in a transmission system.

16. A method for processing data comprising:
    processing a block of data in a data processor in sections to produce at least one section result for each of the sections, and to produce a plurality of different section results for at least one of the sections;
    assembling the section results in various combinations to produce a plurality of results for the block of data;
    the data processor indicating to an error detection circuit to test the plurality of results for errors without outputting the plurality of results;
    checking the results for errors in the error detection circuit; and
    reporting from the error detection circuit to the data processor whether the results contained errors.

17. The method of claim 16, further comprising transferring each of the plurality of results to the error detection circuit along with an instruction to check the transferred results for errors or to output the transferred results.

18. The method of claim 17, further comprising transferring each of the plurality of results to the error detection circuit along with an indication of whether each of the transferred results is the last to be transferred, the method further comprising outputting results that do not contain errors or outputting a last of the results to be transferred along with an error status.

19. The method of claim 17, wherein processing the block of data in a data processor in sections comprises decoding component codewords of a sector of data in a low density parity check decoder, and wherein checking the results for errors in an error detection circuit comprises performing a cyclic redundancy check on the results.

20. A storage system comprising:

a storage medium maintaining a data set;

a read/write head assembly operable to sense the data set on the storage medium and to provide an analog output corresponding to the data set;

an analog to digital converter operable to sample a continuous signal to yield a digital output; and a data processing system operable to process a block of data in the digital output, comprising:

a data processing circuit operable to process the block of data in sections and to yield at least one section result for each of the sections, and to produce a plurality of different section results for at least one of the sections;

an assembler circuit operable to combine the section results from the data processing circuit in different combinations to yield a plurality of possible results based on the block of data;

an error detection circuit operable to test the plurality of possible results for errors and to report to the data processing circuit whether the plurality of possible results contain errors, wherein the data processing system is operable to output any of the possible results in which the error detection circuit found no errors; and an error check only signal operable to transfer an instruction from the data processing circuit to the error detection circuit to test the possible results for errors without outputting the possible results.

* * * * *